(12) United States Patent
Breitling et al.

(10) Patent No.: US 9,890,035 B2
(45) Date of Patent: Feb. 13, 2018

(54) METHOD FOR MANUFACTURING A MICROMECHANICAL COMPONENT

(71) Applicant: Robert Bosch GmbH, Stuttgart (DE)

(72) Inventors: Achim Breitling, Reutlingen (DE); Frank Reichenbach, Wannweil (DE); Jochen Reinmuth, Reutlingen (DE); Julia Amthor, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/401,259

(22) Filed: Jan. 9, 2017

(65) Prior Publication Data

US 2017/0203956 A1    Jul. 20, 2017

(30) Foreign Application Priority Data

Jan. 15, 2016   (DE) .......................... 10 2016 200 497

(51) Int. Cl.
  *B81B 7/00*   (2006.01)
  *B81C 1/00*   (2006.01)

(52) U.S. Cl.
  CPC ........ *B81B 7/0038* (2013.01); *B81C 1/00285* (2013.01); *B81B 2201/0235* (2013.01); *B81B 2201/0242* (2013.01); *B81C 2203/0145* (2013.01)

(58) Field of Classification Search
  CPC ........... H01L 23/3178; H01L 2924/161; H01L 2924/1611; H01L 2924/1615; H01L 2924/16151; H01L 2924/1617; H01L 2924/16171; H01L 2924/163; H01L 2924/164; B81B 7/0038
  See application file for complete search history.

(56) References Cited

U.S. PATENT DOCUMENTS

| | | | | |
|---|---|---|---|---|
| 4,849,071 A | * | 7/1989 | Evans | G01L 9/0042 216/2 |
| 5,095,401 A | * | 3/1992 | Zavracky | G01L 9/0042 257/419 |
| 5,177,661 A | * | 1/1993 | Zavracky | G01L 9/0042 361/283.4 |
| 5,490,034 A | * | 2/1996 | Zavracky | G01L 9/0042 257/419 |
| 5,493,470 A | * | 2/1996 | Zavracky | G01L 9/0042 29/25.42 |

(Continued)

FOREIGN PATENT DOCUMENTS

WO    2015120939 A1    8/2015

*Primary Examiner* — Earl Taylor
(74) *Attorney, Agent, or Firm* — Norton Rose Fulbright US LLP; Gerard Messina

(57) ABSTRACT

A method is provided for manufacturing a micromechanical component including a substrate and including a cap, which is connected to the substrate and, together with the substrate, encloses a first cavity, a first pressure prevailing and a first gas mixture having a first chemical composition being enclosed in the first cavity. A first crystalline layer or a first amorphous layer or a first nanocrystalline layer or a first polycrystalline layer is deposited on or grown on a surface of the substrate or of the cap. A recess is introduced into the substrate or into the cap for accommodating the first crystalline layer or the first amorphous layer or the first nanocrystalline layer or the first polycrystalline layer.

6 Claims, 4 Drawing Sheets

(56) References Cited

U.S. PATENT DOCUMENTS

| | | | | |
|---|---|---|---|---|
| 5,690,841 | A * | 11/1997 | Elderstig | B01L 3/502707 216/2 |
| 6,759,264 | B2 * | 7/2004 | Chou | G06K 9/0002 438/48 |
| 9,411,154 | B2 * | 8/2016 | Reinmuth | G02B 26/0841 |
| 9,434,606 | B2 * | 9/2016 | Classen | B81B 3/0018 |
| 9,556,019 | B2 * | 1/2017 | Dueweke | B81B 7/0038 |
| 9,567,208 | B1 * | 2/2017 | Cheng | B81B 7/0041 |
| 9,670,055 | B2 * | 6/2017 | Reinmuth | B81B 3/00 |
| 2007/0026559 | A1 * | 2/2007 | Haluzak | G02B 26/0833 438/50 |
| 2009/0195125 | A1 * | 8/2009 | Matsugi | H01L 23/10 310/348 |
| 2010/0102678 | A1 * | 4/2010 | Saita | G01L 9/0022 310/344 |
| 2011/0133605 | A1 * | 6/2011 | Ishikawa | H03H 9/1021 310/344 |
| 2012/0299127 | A1 * | 11/2012 | Fujii | B60C 23/0488 257/415 |
| 2013/0074596 | A1 * | 3/2013 | Takizawa | B81B 7/0041 73/504.12 |
| 2015/0123217 | A1 * | 5/2015 | Reinmuth | B81B 3/00 257/415 |
| 2016/0167954 | A1 * | 6/2016 | Gogoi | H01L 27/14 257/415 |
| 2016/0207758 | A1 * | 7/2016 | Kalvesten | H01L 21/50 |
| 2017/0158495 | A1 * | 6/2017 | Breitling | B81C 1/00277 |

* cited by examiner

METHOD FOR MANUFACTURING A MICROMECHANICAL COMPONENT

CROSS REFERENCE

The present application claims the benefit under 35 U.S.C. § 119 of German Patent Application No. DE 102016200497.2 filed on Jan. 15, 2016, which is expressly incorporated herein by reference in its entirety.

BACKGROUND INFORMATION

A method of manufacturing a micromechanical component is described in PCT Application No. WO 2015/120939 A1. When a certain internal pressure is desired in a cavity of a micromechanical component or a gas mixture having a certain chemical composition is to be enclosed in the cavity, the internal pressure or the chemical composition is frequently adjusted during capping of the micromechanical component or during the bonding process between a substrate wafer and a cap wafer. During capping, for example, a cap is connected to a substrate, whereby the cap and the substrate together enclose the cavity. By adjusting the atmosphere or the pressure and/or the chemical composition of the gas mixture present in the surroundings during capping, it is thus possible to adjust the particular internal pressure and/or the particular chemical composition in the cavity.

With the aid of the method described in PCT Application No. WO 2015/120939 A1, an internal pressure may be adjusted in a targeted way in a cavity of a micromechanical component. It is in particular possible with the aid of this method to manufacture a micromechanical component having a first cavity, a first pressure and a first chemical composition being adjustable in the first cavity, which differ from a second pressure and a second chemical composition at the time of capping.

In the method for targeted adjusting of an internal pressure in a cavity of a micromechanical component described in PCT Application No. WO 2015/120939 A1, a narrow access channel to the cavity is created in the cap or in the cap wafer, or in the substrate or in the sensor wafer. Subsequently, the cavity is flooded with the desired gas and the desired internal pressure via the access channel. Finally, the area around the access channel is locally heated with the aid of a laser, the substrate material liquefies locally and hermetically seals the access channel during solidification.

SUMMARY

It is an object of the present invention to provide a method for manufacturing a micromechanical component which is mechanically robust and has a long service life compared to the related art, in a simple and cost-effective manner compared to the related art. It is a further object of the present invention to provide a micromechanical component which is compact, mechanically robust and has a long service life compared to the related art. According to the present invention, this applies, in particular, to a micromechanical component that includes one (first) cavity. With the aid of the method according to the present invention and the micromechanical component according to the present invention, it is furthermore also possible to implement a micromechanical component in which a first pressure and a first chemical composition may be adjusted in the first cavity, and a second pressure and a second chemical composition may be adjusted in a second cavity. For example, such a method for manufacturing micromechanical components is provided, for which it is advantageous if a first pressure is enclosed in a first cavity and a second pressure is enclosed in a second cavity, the first pressure being different from the second pressure. This is the case, for example, when a first sensor unit for rotation rate measurement and a second sensor unit for acceleration measurement are to be integrated into a micromechanical component.

The object may be achieved in accordance with an example embodiment of the present invention by providing:
in a fifth method step, a recess is introduced into the substrate or into the cap for accommodating the first crystalline layer or the first amorphous layer or the first nanocrystalline layer or the first polycrystalline layer.

In this way, a method for manufacturing a micromechanical component is provided in a simple and cost-effective manner, with the aid of which the first crystalline layer or the first amorphous layer or the first nanocrystalline layer or the first polycrystalline layer may be accommodated with the aid of the recess. This advantageously makes it possible, for example, for the first crystalline layer or the first amorphous layer or the first nanocrystalline layer or the first polycrystalline layer to be deposited chronologically before a partial removal or a grinding or a polishing of the substrate or of the cap and to remain situated in the recess after the removal or grinding or polishing. Thus, it is advantageously possible that the first crystalline layer or the first amorphous layer or the first nanocrystalline layer or the first polycrystalline layer may already be deposited on or grown on the surface of the substrate or of the cap chronologically before the removal or grinding or polishing. This is often advantageous in the case of predefined temperature budgets and/or to prevent contaminations.

Moreover, it is advantageously possible with the method according to the present invention that the resistance to crack formation and/or crack propagation in the vicinity of a material area of the substrate or of the cap, which in the third method step transitions into a liquid aggregate state and after the third method step transitions into a solid aggregate state and seals the access opening, may be increased with the aid of targeted adjustment of the crystallinity of the materials used.

An increased resistance to crack formation and/or crack propagation is achieved, for example, in that the grain boundaries of polycrystalline layers or of a polycrystalline substrate act as a barrier against the propagation of cracks. Micro-cracks in particular are unable or able only with increased intensity to propagate along the crystalline axis through the entire seal or material area. Instead, micro-cracks stop at the grain boundary or at the grain boundaries. In this way, a tearing of the seal is prevented or substantially hindered. An increased resistance to crack formation is also achieved, for example, in that a first stress, which counteracts or compensates for a second stress occurring in the seal or in the material area, or emanating from the seal or the material area, is produced or created or acts as a result of application of the first crystalline, amorphous, nanocrystalline or polycrystalline layer. The first stress is a compressive stress, for example.

In addition, it is less problematic with the method according to the present invention if the substrate material is only heated locally, and the heated material contracts relative to its surroundings, both during solidification and during cooling. It is also less problematic that tensile stresses may develop in the sealing area. Finally, a spontaneously occurring crack formation depending on the stress and material and a crack formation during thermal or mechanical loading of the micromechanical component is also less likely during the further processing or in the field.

Moreover, it is less critical with the method according to the present invention if, during solidification of the material area of the substrate or of the cap due to the recrystallization dynamic, a peak forms in the middle of the fused zone or in the middle of the solidified material area, since a protrusion of the peak over the surface of the substrate or of the cap may be reduced or prevented by a targeted coordination of the depth of the recess in the sense of an extension of the recess from the surface in the direction of the first cavity and the thickness of the first layer and, optionally, additional layers in the sense of an extension of the first layer and, optionally, additional layers from the surface in the direction of the first cavity. Thus, by using the recess, the likelihood of damage to such a peak or an unintended contacting during the further manufacturing flow of the peak is also avoided. The influence of an additional source for the formation of cracks in the substrate or in the cap is therefore advantageously reduced.

Thus, a method for manufacturing a mechanically robust micromechanical component is provided having a long service life compared to the related art in a simple and cost-effective manner compared to the related art.

In connection with the present invention, the term "micromechanical component" is to be understood in that the term encompasses both micromechanical components and microelectromechanical components.

In addition, the term "crystalline" is understood in conjunction with the present invention to mean "monocrystalline" or "single crystalline". Thus, in conjunction with the present invention, the use of the term "crystalline" means a single crystal or monocrystal or a macroscopic crystal, the atoms or molecules of which form a continuous uniform homogenous crystal lattice. In other words, the term "crystalline" means that essentially all distances of each atom relative to its neighboring atoms are clearly defined. In conjunction with the present invention, "crystalline" is understood, in particular, to mean that the potentially theoretical crystalline sizes or grain sizes are greater than 1 cm or are infinite. The terms "polycrystalline" and "nanocrystalline" are understood in conjunction with the present invention to mean that a crystalline solid body is meant, which includes a plurality of individual crystals or crystallites or grains, the grains being separated from one another by grain boundaries. In conjunction with the present invention, "polycrystalline" is understood, in particular, to mean that the crystallite sizes or grain sizes range from 1 µm to 1 cm. In addition, "nanocrystalline" is understood in conjunction with the present invention to mean, in particular, that the crystallite sizes or grain sizes are smaller than 1 µm. Furthermore, the term "amorphous" is understood in conjunction with the present invention to mean, in particular, that the atoms of an amorphous layer or of an amorphous material merely have a near-order but not a far-order. In other words, "amorphous" means that the distance of each atom is clearly defined only relative to its first closest neighboring atoms, but not to its second and further closest neighboring atoms.

The present invention is preferably provided for a micromechanical component including its cavity or its manufacture. However, the present invention is also provided, for example, for a micromechanical component having two cavities, or having more than two, i.e., three, four, five, six or more than six, cavities.

The access opening is preferably sealed by introducing energy or heat with the aid of a laser into a part of the substrate or of the cap which absorbs this energy or this heat. Energy or heat is preferably introduced chronologically in succession into the respective absorbing part of the substrate or of the cap of multiple micromechanical components, which are manufactured together on a wafer, for example. However, alternatively, it is also possible to introduce the energy or heat simultaneously into the respective absorbing part of the substrate or of the cap of multiple micromechanical components, for example using multiple laser beams or laser devices.

Advantageous embodiments and refinements of the present invention may be derived from the description herein with reference to the drawings.

According to one preferred refinement, it is provided that the cap, together with the substrate, encloses a second cavity, a second pressure prevailing and a second gas mixture having a second chemical composition being enclosed in the second cavity.

According to one preferred refinement, it is provided that in a sixth method step, a second crystalline layer or a second amorphous layer or a second nanocrystalline layer or a second polycrystalline layer is deposited on or grown on the first crystalline layer or on the first amorphous layer or on the first nanocrystalline layer or on the first polycrystalline layer.

According to one preferred refinement, it is provided that in a seventh method step, a third crystalline layer or a third amorphous layer or a third nanocrystalline layer or a third polycrystalline layer is deposited on or grown on the second crystalline layer or on the second amorphous layer or on the second nanocrystalline layer or on the second polycrystalline layer.

According to one preferred refinement, it is provided that in an eighth method step, a fourth crystalline layer or a fourth amorphous layer or a fourth nanocrystalline layer or a fourth polycrystalline layer is deposited on or grown on the third crystalline layer or on the third amorphous layer or on the third nanocrystalline layer or on the third polycrystalline layer.

According to one preferred refinement, it is provided that in an eleventh method step, a fifth crystalline layer or a fifth amorphous layer or a fifth nanocrystalline layer or a fifth polycrystalline layer is deposited on or grown on the fourth crystalline layer or on the fourth amorphous layer or on the fourth nanocrystalline layer or on the fourth polycrystalline layer.

By applying a layer or a layer packet having a certain crystallinity, it is possible, for example, to adjust the layer stresses, preferably compressive stresses, in such a way that the stresses occurring in the material area or in the seal may be compensated for.

According to one preferred refinement, it is provided that in a ninth method step
  the substrate or the cap and/or
  the first crystalline layer or the first amorphous layer or the first nanocrystalline layer or the first polycrystalline layer and/or
  the second crystalline layer or the second amorphous layer or the second nanocrystalline layer or the second polycrystalline layer and/or
  the third crystalline layer or the third amorphous layer or the third nanocrystalline layer or the third polycrystalline layer and/or
  the fourth crystalline layer or the fourth amorphous layer or the fourth nanocrystalline layer or the fourth polycrystalline layer is at least partially removed. This advantageously makes it possible for the substrate or the cap to be brought to a desired thickness in the sense of an extension of the substrate or of the cap essentially from a surface of the substrate or of the cap facing away from the first cavity to the first cavity.

According to one advantageous refinement, it is provided that the substrate or the cap is pivoted in a first pivot step chronologically after the fifth method step essentially by 180° about an axis extending essentially in parallel to the surface of the substrate or of the cap, the substrate or the cap being pivoted in a second pivot step chronologically before the ninth method step essentially by 180° about the axis extending essentially in parallel to the surface of the substrate or of the cap. This advantageously makes it possible for the pre-structured cap wafer or the cap or the sensor wafer or the substrate to be processed with the pre-structured side as a rear side using a standard process.

According to one preferred refinement, it is provided that the second pivot step is carried out chronologically after the first pivot step. According to one preferred refinement, it is provided that the first pivot step and the second pivot step are carried out chronologically after the fourth method step and/or chronologically after the sixth method step.

According to one preferred refinement, it is provided that a layer facing the surroundings of the micromechanical component has a lower melting temperature compared to the other layers. This advantageously makes it possible for the layer facing the surroundings of the micromechanical component to be fused in a targeted manner, for example, in the third method step.

According to one preferred refinement, it is provided that in a tenth method step
the substrate or the cap and/or
the first crystalline layer or the first amorphous layer or the first nanocrystalline layer or the first polycrystalline layer and/or
the second crystalline layer or the second amorphous layer or the second nanocrystalline layer or the second polycrystalline layer and/or
the third crystalline layer or the third amorphous layer or the third nanocrystalline layer or the third polycrystalline layer and/or
the fourth crystalline layer or the fourth amorphous layer or the fourth nanocrystalline layer or the fourth polycrystalline layer are doped. Thus, an increased resistance to crack formation is advantageously achieved by the doping of the material. As a result of the doping, the crystalline structure of the material or of the layers is changed, for example. A changed crystalline structure or material structure may, for example, make the material more resistant to crack formation.

Additional subject matter of the present invention is a micromechanical component including a substrate and a cap which is connected to the substrate and, together with the substrate, encloses a first cavity, a first pressure prevailing and a first gas mixture having a first chemical composition being enclosed in the first cavity, the substrate or the cap including a sealed access opening
the micromechanical component including a first crystalline layer or first amorphous layer or first nanocrystalline layer or first polycrystalline layer deposited on or grown on a surface of the substrate or of the cap and/or
the substrate or the cap including a recess for accommodating the first crystalline layer or the first amorphous layer or first nanocrystalline layer or first polycrystalline layer. In this way, a compact, mechanically robust and cost-effective micromechanical component having an adjusted first pressure is advantageously provided.

The above-mentioned advantages of the method according to the present invention apply correspondingly also to the micromechanical component according to the present invention.

According to one preferred refinement, it is provided that the micromechanical component includes a second crystalline layer or second amorphous layer or second nanocrystalline layer or second polycrystalline layer grown on or deposited on the first crystalline layer or on the first amorphous layer or on the first nanocrystalline layer or on the first polycrystalline layer. In this way, it is advantageously possible, for example, to adjust the layer stresses, preferably compressive stresses, in such a way that the stresses occurring in the material area or in the seal may be compensated for.

According to one preferred refinement, it is provided that the cap, together with the substrate, encloses a second cavity, a second pressure prevailing and a second gas mixture having a second chemical composition being enclosed in the second cavity. In this way, a compact, mechanically robust and cost-effective micromechanical component having an adjusted first pressure and second pressure is advantageously provided.

According to one preferred refinement, it is provided that the first pressure is lower than the second pressure, a first sensor unit for rotation rate measurement being situated in the first cavity, and a second sensor unit for acceleration measurement being situated in the second cavity. In this way, a mechanically robust micromechanical component for rotation rate measurement and acceleration measurement, having optimal operating conditions for both the first sensor unit and the second sensor unit, is advantageously provided.

DETAILED DESCRIPTION OF EXAMPLE EMBODIMENTS

Figure 1:
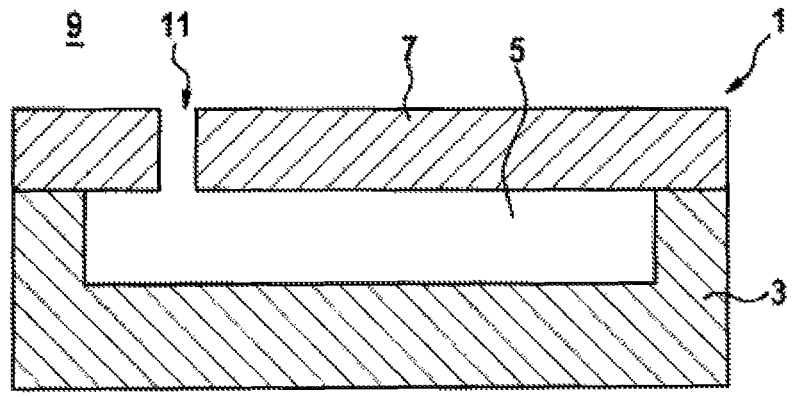
FIG. 1 shows a micromechanical component having an open access opening according to one exemplary specific embodiment of the present invention in a schematic representation.

Identical parts are denoted by the same reference numerals in the various figures and are therefore generally also cited or mentioned only once.

Figure 2:
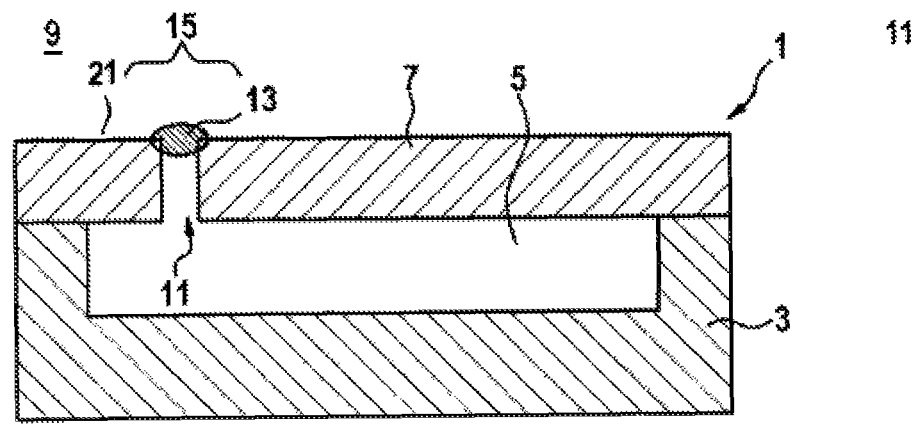
FIG. 2 shows the micromechanical component according to FIG. 1 having a sealed access opening in a schematic representation.

FIG. 1 and FIG. 2 show a schematic representation of a micromechanical component 1 having an open access opening 11 in FIG. 1, and having a sealed access opening 11 in FIG. 2, according to one exemplary specific embodiment of the present invention. Micromechanical component 1 includes a substrate 3 and a cap 7. Substrate 3 and cap 7 are, preferably hermetically, connected to one another and together enclose a first cavity 5. For example, micromechanical component 1 is designed in such a way that substrate 3 and cap 7 additionally together enclose a second cavity. The second cavity, however, is not shown in FIG. 1 and in FIG. 2.

For example, a first pressure prevails in first cavity 5, in particular when access opening 11 is sealed, as shown in FIG. 2. Moreover, a first gas mixture having a first chemical composition is enclosed in first cavity 5. In addition, for example, a second pressure prevails in the second cavity, and a second gas mixture having a second chemical composition is enclosed in the second cavity. Access opening 11 is preferably situated in substrate 3 or in cap 7. In the present exemplary embodiment, access opening 11 is situated in cap 7 by way of example. According to the present invention, however, it may also be alternatively provided that access opening 11 is situated in substrate 3.

It is provided, for example, that the first pressure in first cavity 5 is lower than the second pressure in the second cavity. It is also provided, for example, that a first micromechanical sensor unit for rotation rate measurement, which is not shown in FIG. 1 and FIG. 2, is situated in first cavity 5, and a second micromechanical sensor unit for acceleration measurement, which is not shown in FIG. 1 and FIG. 2, is situated in the second cavity.

Figure 3:
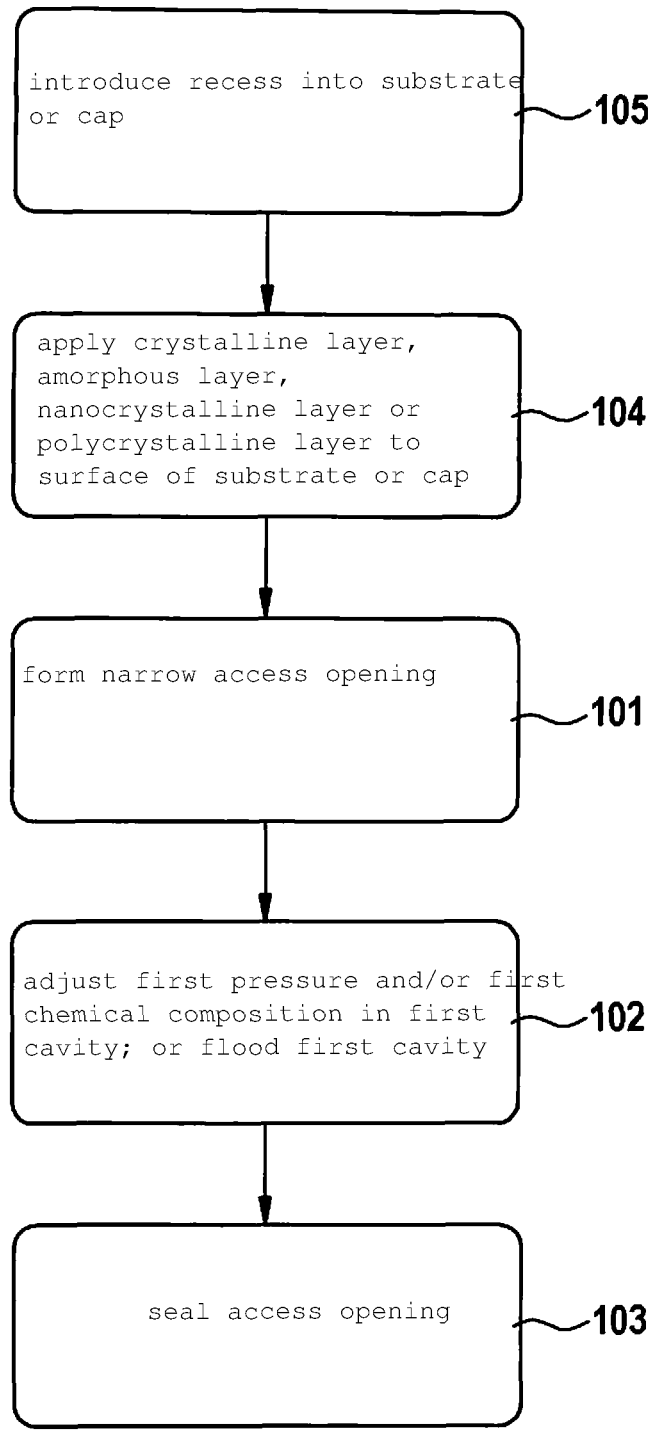
FIG. 3 shows a method for manufacturing a micromechanical component according to one exemplary specific embodiment of the present invention in a schematic representation.

FIG. 3 shows a method for manufacturing micromechanical component 1 according to one exemplary embodiment of the present invention in a schematic representation. In this method, in a first method step 101, in particular narrow access opening 11 connecting first cavity 5 to surroundings 9 of micromechanical component 1 is formed in substrate 3 or in cap 7. FIG. 1 shows micromechanical component 1 after first method step 101 by way of example. Moreover, in a second method step 102, the first pressure and/or the first chemical composition in first cavity 5 is adjusted, or first cavity 5 is flooded with the desired gas and the desired internal pressure via the access channel. Furthermore, for example, in a third method step 103, access opening 11 is sealed by introducing energy or heat with the aid of a laser into an absorbing part 21 of substrate 3 or cap 7. Alternatively, for example, it is also provided that in the third method step 103, the area around the access channel is preferably heated only locally by a laser, and the access channel is hermetically sealed. Thus, it is advantageously possible to also provide the method according to the present invention with energy sources other than with a laser for sealing access opening 11. FIG. 2 shows micromechanical component 1 after third method step 103 by way of example.

Chronologically after third method step 103, it is possible for mechanical stresses to occur in a lateral area 15, shown by way of example in FIG. 2, on a surface facing away from cavity 5 of cap 7 and in the depth perpendicularly to a projection of lateral area 15 onto the surface, i.e., along access opening 11 and in the direction of first cavity 5 of micromechanical component 1. These mechanical stresses, in particular local mechanical stresses, prevail in particular on and in the vicinity of an interface between a material area 13 of cap 7, which in third method step 103 transitions into a liquid aggregate state and after third method step 103 transitions into a solid aggregate state and seals access opening 11, and a remaining area of cap 7, which remains in a solid aggregate state during third method step 103. In FIG. 2, material area 13 of cap 7 sealing access opening 11 is to be regarded only schematically or is shown only schematically, in particular with respect to its lateral extension or form, extending in particular in parallel to the surface, and in particular with respect to its expansion or configuration perpendicularly to the lateral extension, running in particular perpendicularly to the surface.

As shown in FIG. 3 by way of example, in a fourth method step 104, a first crystalline layer or a first amorphous layer or a first nanocrystalline layer or a first polycrystalline layer is deposited on or grown on a surface of substrate 3 or of cap 7.

In other words, in fourth method step 104, for example, a layer of a second crystalline, amorphous, nanocrystalline or preferably polycrystalline material or a material packet of the cited materials or layers is applied to a crystalline substrate material or cap material or to the sensor wafer or to the cap wafer. This occurs, for example, at least partially in a fourth method step 104, which chronologically precedes first method step 101. In other words, it is provided, for example, that fourth method step 104 is carried out chronologically before first method step 101. According to the present invention, it is alternatively or additionally provided, however, that fourth method step 104 is carried out chronologically after third method step 103.

In addition, as is shown by way of example in FIG. 3, for example, in a fifth method step 105, a recess is introduced into substrate 3 or into cap 7 for accommodating the first crystalline layer or the first amorphous layer or the first nanocrystalline layer or the first polycrystalline layer. In this case, it is provided, for example, that fifth method step 105 is carried out chronologically before fourth method step 104.

In addition, it is provided, for example, that in a sixth method step, a second crystalline layer or a second amorphous layer or a second nanocrystalline layer or a second polycrystalline layer is deposited on or grown on the first crystalline layer or on the first amorphous layer or on the first nanocrystalline layer or on the first polycrystalline layer. In addition, in a seventh method step, for example, a third crystalline layer or a third amorphous layer or a third nanocrystalline layer or a third polycrystalline layer is deposited on or grown on the second crystalline layer or on the second amorphous layer or on the second nanocrystalline layer or on the second polycrystalline layer. Furthermore, in an eighth method step, for example, a fourth crystalline layer or a fourth amorphous layer or a fourth nanocrystalline layer or a fourth polycrystalline layer is also deposited on or grown on the third crystalline layer or on the third amorphous layer or on the third nanocrystalline layer or on the third polycrystalline layer.

When using a layer packet, it is in particular, also provided, for example, that in third method step 103 only the uppermost layer is fused in a target manner.

It is also provided, for example, that in a ninth method step 109 substrate 3 or cap 7 and/or the first crystalline layer or the first amorphous layer or the first nanocrystalline layer or the first polycrystalline layer and/or the second crystalline layer or the second amorphous layer or the second nanocrystalline layer or the second polycrystalline layer and/or the third crystalline layer or the third amorphous layer or the third nanocrystalline layer or the third polycrystalline layer and/or the fourth crystalline layer or the fourth amorphous layer or the fourth nanocrystalline layer or the fourth polycrystalline layer is at least partially removed.

Moreover, it is also provided, for example, that in a tenth method step
- substrate 3 or cap 7 and/or
- the first crystalline layer or the first amorphous layer or the first nanocrystalline layer or the first polycrystalline layer and/or
- the second crystalline layer or the second amorphous layer or the second nanocrystalline layer or the second polycrystalline layer and/or
- the third crystalline layer or the third amorphous layer or the third nanocrystalline layer or the third polycrystalline layer and/or
- the fourth crystalline layer or the fourth amorphous layer or the fourth nanocrystalline layer or the fourth polycrystalline layer is doped.

Figure 4:
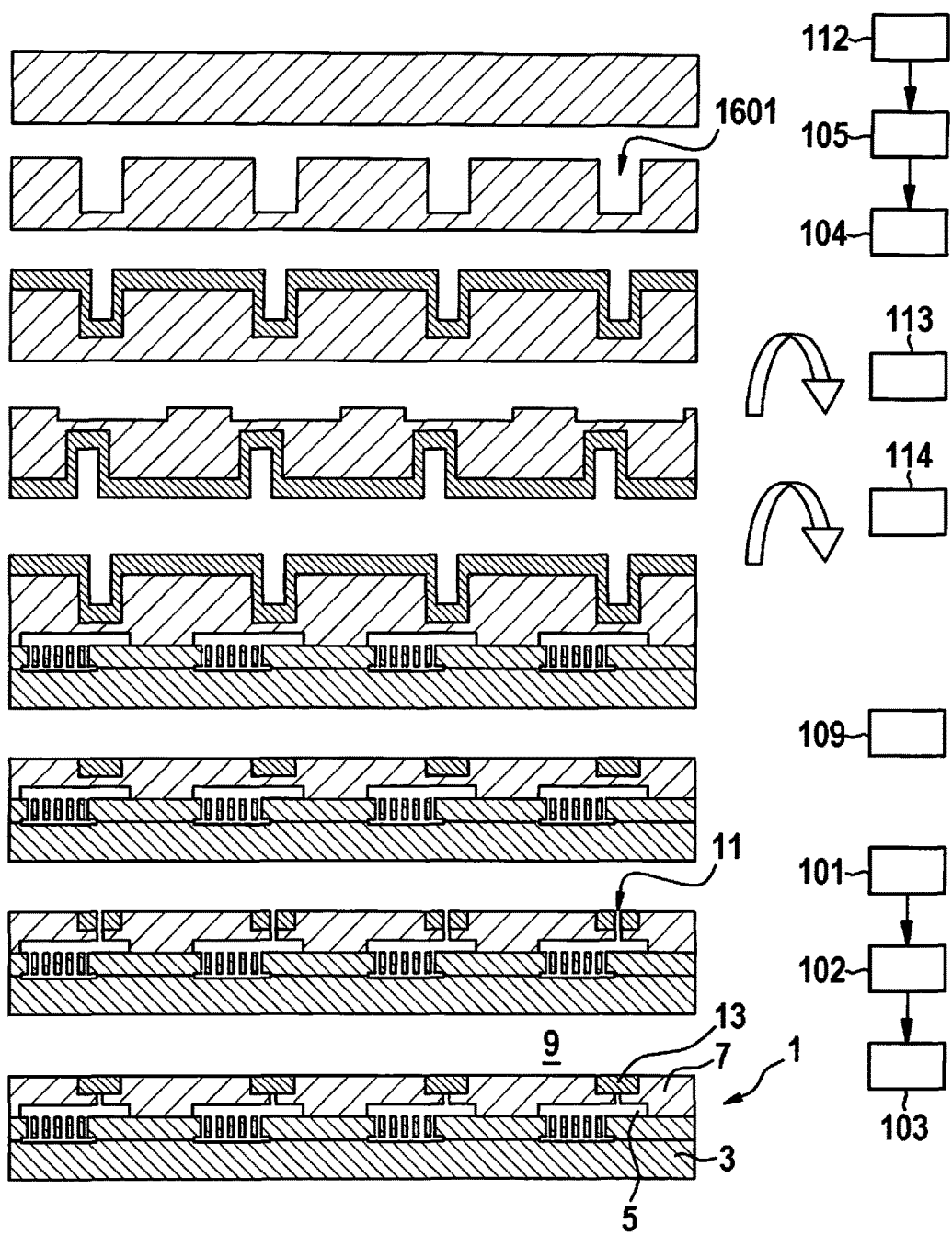
FIGS. 4 and 5 show micromechanical components at different points in time during the method according to the present invention for manufacturing a micromechanical component according to exemplary specific embodiments of the present invention in schematic representations.
Figure 5:
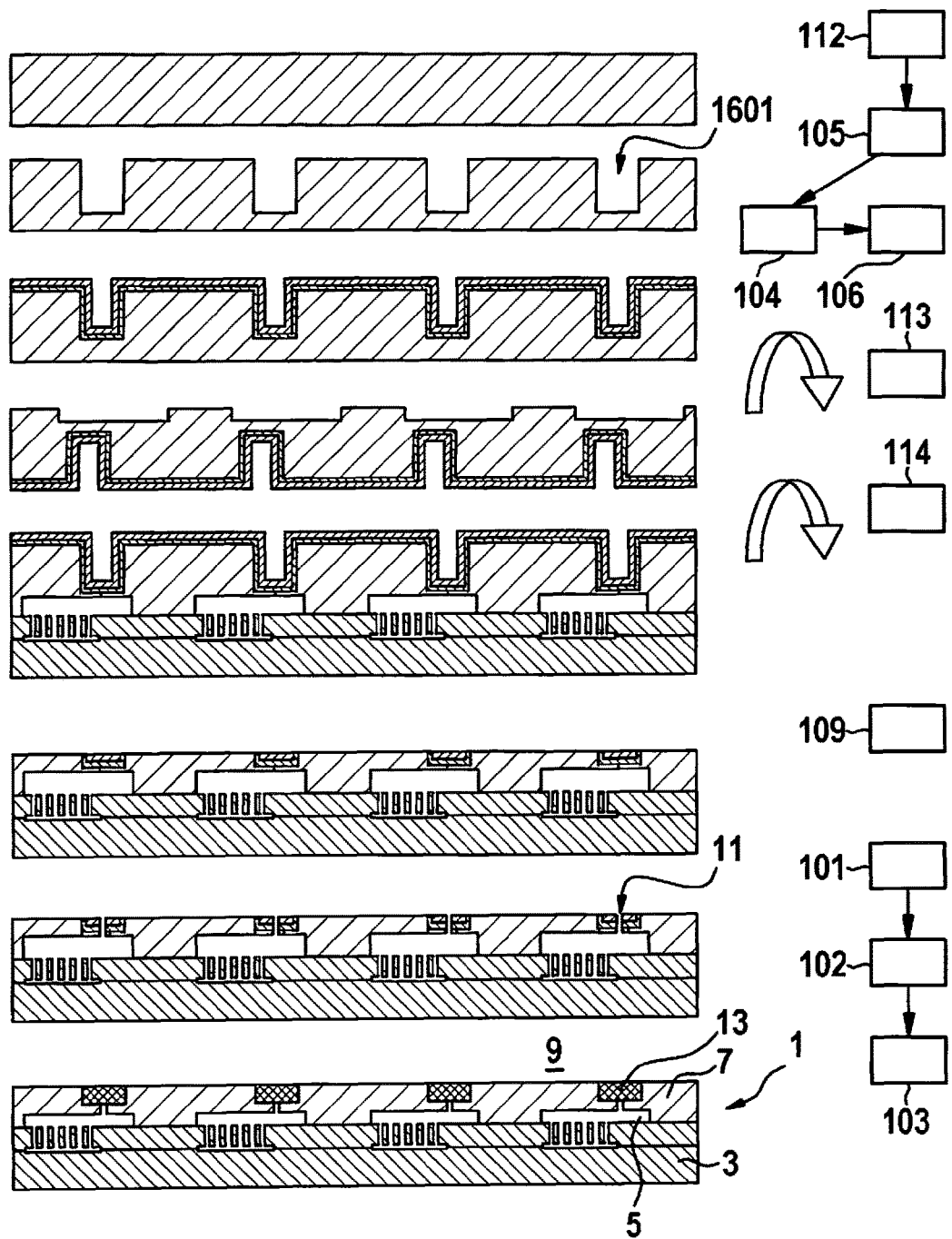

In FIGS. 4 and 5, micromechanical components are shown at different points in time during the method according to the present invention for manufacturing a micromechanical component according to exemplary specific embodiments of the present invention in schematic representations. FIGS. 4 and 5 show that in a twelfth method step 112, cap 7 or a cap substrate or a cap wafer is provided or made available. For example, it is alternatively also provided that in twelfth method step 112, substrate 3 or a substrate wafer or a sensor substrate is provided or made available. In this case, it is provided, for example that twelfth method step 112 is carried out chronologically before fifth method step 105. Moreover, it is also provided, for example, that in twelfth method step 112, a crystalline substrate material or a crystalline cap wafer or a sensor wafer is provided. For example, it is alternatively also provided that in twelfth method step 112, an amorphous, nanocrystalline or preferably polycrystalline substrate material or cap material or cap wafer material or sensor wafer material is provided.

FIGS. 4 and 5 show that fifth method step 105 is carried out chronologically after twelfth method step 112. In other words, in fifth method step 105, an indentation or recess 1601 is etched in cap 7 or in the cap substrate or in the cap wafer at the point at which the first layer and, if necessary, the second layer and the additional layers or a layered stack including the layers is to be later positioned or situated. The depth of the etching or an extension of recess 1601 essentially from the surface of substrate 3 or of cap 7 in the direction of first cavity 5 is designed in such a way that the remaining substrate thickness or thickness of substrate 3 or cap thickness or thickness of cap 7, together with the desired thickness of the layer or with the desired thickness of multiple layers, i.e., of the first layer, the second layer, the third layer, etc. or of the desired thickness of the layered stack, corresponds to the final thickness of the cap wafer or of the sensor wafer or of substrate 3 or of cap 7. Thickness in each case means an extension essentially from the surface of substrate 3 or cap 7 in the direction of first cavity 5. Final thickness of the cap wafer or of the sensor wafers means, for example, the thickness of substrate 3 or of cap 7 after ninth method step 109.

In FIGS. 4 and 5, it is shown by way of example that fourth method step 104 is carried out chronologically after fifth method step 105. In other words, the first layer is applied chronologically after fifth method step 105. In FIG. 5, it is shown by way of example that sixth method step 106 is carried out chronologically after fourth method step 104. In other words, the second layer is applied chronologically after fourth method step 104. It is also provided, for example, that a layered stack including multiple layers is applied.

FIG. 4 and FIG. 5 show by way of example that in a thirteenth method step 113 the thus pre-structured cap wafer or cap 7 or the sensor wafer or substrate 3 is processed next or chronologically after fourth method step 104 with the pre-structured side as the rear side using a standard process. If recess 1601 is situated in cap 7, the standard process means, for example, that an additional recess for first cavity 5 is formed in cap 7. This is shown by way of example in FIG. 4 and FIG. 5. If recess 1601 is situated in the substrate, the standard process means, for example, that a sensor structure is formed in or on substrate 3.

In addition, it is shown by way of example in FIG. 4 and FIG. 5 that a fourteenth method step 114 is carried out chronologically after thirteenth method step 113. In this case, the sensor wafer or substrate 3 is bonded or joined in fourteenth method step 114 with the cap wafer or cap 7. In other words, a bonding process is carried out in fourteenth method step 114 between the sensor wafer or substrate 3 and the cap wafer or the cap.

It is provided, for example, that substrate 3 or cap 7 is pivoted in a first pivot step chronologically after fifth method step 105 essentially by 180° about an axis extending essentially in parallel to the surface of substrate 3 or cap 7. The first pivot step is shown by way of example in FIG. 4 and FIG. 5 with an arrow. It is provided, for example, that the first pivot step is carried out chronologically after fourth method step 104 and chronologically before thirteenth method step 113. Moreover, it is also provided, for example, that substrate 3 or cap 7 is pivoted in a second pivot step chronologically before ninth method step 109 essentially by 180° about the axis extending essentially in parallel to the surface of substrate 3 or of cap 7. The second pivot step is shown by way of example in FIG. 4 and FIG. 5 with an additional arrow. It is provided, for example, that the second pivot step is carried out chronologically after thirteenth method step 113 and chronologically before fourteenth method step 114.

Furthermore, it is shown by way of example in FIG. 4 and in FIG. 5 that ninth method step 109 is carried out chronologically after fourteenth method step 114. In other words, the cap wafer or cap 7 and the sensor wafer or substrate 3 is thinned to the desired thickness chronologically after fourteenth method step 114. In this case, for example, the applied first layer or layered stack is removed from the surface and remains only at the etching ground of the indentation or recess 1601. The result of ninth method step 109 is a planar cap surface or planar sensor surface having imbedded areas of the first layer or of the first layer and the second layer or of the layered stack including multiple layers.

It is provided, as shown in FIG. 4 and FIG. 5, for example, that chronologically after ninth method step 109, initially first method step 101, then second method step 102 and finally third method step 103 is carried out. In other words, access opening 11 or multiple access openings 11 or access channels are first opened chronologically after ninth method step 109 and subsequently sealed again with the aid of a laser.

It is also provided, for example, that fifth method step 105 is carried out chronologically after thirteenth method step 113. In other words, it is provided, for example, that recess 1601 is introduced into substrate 3 or into cap 7 or formed in substrate 3 or in cap 7 after the standard processing of the cap wafer or sensor wafer or cap 7 or of substrate 3, but before the joining of the cap wafer and sensor wafer or cap 7 and substrate 3.

In addition, it is also provided, for example, that the layer thickness of the first layer or of the layered stack including multiple layers is designed in such a way that the laser seal or the area fused by the laser or material area 13 lies or takes place completely in the first layer or in the layered stack. In other words, it is provided, for example, that the layer thickness of the first layer or of the layered stack is designed in such a way that the first layer or the layered stack essentially completely includes material area 13.

Moreover, it is also provided, for example that the indentation or recess 1601 is designed in such a way that the remaining substrate thickness or the thickness of substrate 3 or the thickness of cap 7 is less than the desired final thickness of the cap wafer or the sensor wafer or substrate 3 or of cap 7. Final thickness of the cap wafer or of the sensor wafer in this case means, for example, the thickness of substrate 3 or of cap 7 after ninth method step 109. This advantageously makes it possible that after the back-thinning of the cap wafer or of the sensor wafer, or chronologically after ninth method step 109, the first layer or the layered stack is countersunk relative to the wafer surface or relative to the surface.

In addition, it is provided, for example, that a natural oxide is removed or that passivation against renewed oxidation occurs. In this case, it is provided, for example, that the natural oxide is removed from the cap wafer or sensor wafer or from cap 7 or from substrate 3. Furthermore, it is also provided, for example, that the cap wafer or the sensor wafer or substrate 3 or cap 7 is protected against renewed oxidation.

In addition, it is also provided, for example, that the doped or undoped substrate material or the applied material or material packet or the substrate material and the applied material or material packet are fused during the local heating process, for example, during third method step 103.

Finally, it is provided that the micromechanical component 1 manufactured with the method according to the present invention includes, for example, various cap materials, multilayer caps or modified cap materials, and which differ, for example, from the related art.

What is claimed is:

1. A method for manufacturing a micromechanical component including a substrate and a cap which is connected to the substrate, the cap, together with the substrate, enclosing a first cavity, a first pressure prevailing and a first gas mixture having a first chemical composition being enclosed in the first cavity, the method comprising:
    in a first method step, forming an access opening connecting the first cavity to surroundings of the micromechanical component in the substrate or in the cap;
    in a second method step, adjusting at least one of the first pressure and the first chemical composition, in the first cavity;
    in a third method step, sealing the access opening by introducing energy or heat into an absorbing part of the substrate or the cap, with the aid of a laser;
    in a fourth method step, depositing or growing one of: i) a first crystalline layer, ii) a first amorphous layer, iii) a first nanocrystalline layer, or iv) a first polycrystalline layer, on a surface of the substrate or of the cap;
    in a fifth method step, introducing a recess into the substrate or into the cap for accommodating the one of the first crystalline layer, the first amorphous layer, the first nanocrystalline layer, or the first polycrystalline layer;
    in a sixth method step, depositing or growing one of: i) a second crystalline layer, ii) a second amorphous layer, iii) a second nanocrystalline layer, or iv) a second polycrystalline layer, on the one of the first crystalline layer, the first amorphous layer, the first nanocrystalline layer, or the first polycrystalline layer; and
    in a seventh method step, depositing or growing one of: i) a third crystalline layer, ii) a third amorphous layer, iii) a third nanocrystalline layer, or iv) a third polycrystalline layer, on the one of the second crystalline layer, the second amorphous layer, the second nanocrystalline layer, or the second polycrystalline layer.

2. The method as recited in claim 1, further comprising:
    in an eight method step, depositing or growing one of: i) a fourth crystalline layer, ii) a fourth amorphous layer, iii) a fourth nanocrystalline layer, or iv) a fourth polycrystalline layer, on the one of the third crystalline layer, the third amorphous layer, the third nanocrystalline layer, or the third polycrystalline layer; and
    in a ninth method step, at least partially removing at least one of: i) the substrate or the cap, ii) the one of the first crystalline layer, the first amorphous layer, the first nanocrystalline layer, or the first polycrystalline layer, iii) the one of the second crystalline layer, the second amorphous layer, the second nanocrystalline layer, or the second polycrystalline layer, iv) the one of the third crystalline layer, the third amorphous layer, the third nanocrystalline layer, or the third polycrystalline layer, and v) the one of the fourth crystalline layer, the fourth amorphous layer, the fourth nanocrystalline layer, or the fourth polycrystalline layer.

3. The method as recited in claim 2, wherein the substrate or the cap is pivoted in a first pivot step chronologically after the fifth method step essentially by 180° about an axis extending essentially in parallel to the surface of the substrate or of the cap, the substrate or the cap being pivoted in a second pivot step chronologically before the ninth method step essentially by 180° about the axis extending essentially in parallel to the surface of the substrate or of the cap.

4. The method as recited in claim 3, further comprising:
    in a tenth method step, doping at least one of: i) the substrate or the cap, ii) the one of the first crystalline layer, the first amorphous layer, the first nanocrystalline layer, or the first polycrystalline layer, iii) the one of the second crystalline layer, the second amorphous layer, the second nanocrystalline layer, or the second polycrystalline layer, iv) the one of the third crystalline layer, the third amorphous layer, the third nanocrystalline layer, or the third polycrystalline layer, and v) the one of the fourth crystalline layer, the fourth amorphous layer, the fourth nanocrystalline layer, or the fourth polycrystalline layer.

5. A micromechanical component, comprising:
    a substrate;
    a cap connected to the substrate, wherein the cap, together with the substrate, encloses a first cavity, a first pressure prevailing and a first gas mixture having a first chemical composition being enclosed in the first cavity, the substrate or the cap including a sealed access opening;
    one of a first crystalline layer, first amorphous layer, first nanocrystalline layer, or first polycrystalline layer deposited on or grown on a surface of the substrate or of the cap; and
    one of a second crystalline layer, second amorphous layer, second nanocrystalline layer, or second polycrystalline layer deposited on or grown on the one of the first crystalline layer, the first amorphous layer, the first nanocrystalline layer, or the first polycrystalline layer;
    wherein the substrate or the cap includes a recess for accommodating the one of the first crystalline layer, the first amorphous layer, the first nanocrystalline layer, and the first polycrystalline layer, wherein the first pressure is lower than the second pressure, a first sensor unit for rotation rate measurement being situated in the first cavity and a second sensor unit for acceleration measurement being situated in the second cavity.

6. The micromechanical component as recited in claim 5, wherein the cap, together with the substrate, encloses a second cavity, a second pressure prevailing and a second gas mixture having a second chemical composition being enclosed in the second cavity.

* * * * *